United States Patent [19]

Van Zanten et al.

[11] Patent Number: 4,918,331
[45] Date of Patent: Apr. 17, 1990

[54] LOGIC CIRCUITS WITH DATA RESYNCHRONIZATION

[75] Inventors: Adrianus T. Van Zanten; Hendrikus J. M. Veendrick; Leonardus C. M. G. Pfennings, all of Eindhoven, Netherlands

[73] Assignee: U.S. Philips Corp., New York, N.Y.

[21] Appl. No.: 358,478

[22] Filed: May 26, 1989

Related U.S. Application Data

[63] Continuation of Ser. No. 251,067, Sep. 27, 1988, abandoned, which is a continuation of Ser. No. 125,749, Nov. 20, 1987, abandoned, which is a continuation of Ser. No. 890,599, Jul. 30, 1986, abandoned.

[30] Foreign Application Priority Data

Oct. 21, 1985 [NL]  Netherlands ................ 8502859

[51] Int. Cl.⁴ .................... H03K 5/15; H03K 19/003
[52] U.S. Cl. ..................................... 307/269; 307/443; 307/272.2; 307/480
[58] Field of Search ............... 307/269, 272.2, 443, 307/480; 328/63, 72

[56] References Cited

U.S. PATENT DOCUMENTS 4,540,903  9/1985  Cooke et al. .................... 307/269

FOREIGN PATENT DOCUMENTS 0025294  2/1980  Japan .................... 307/269
0074815  4/1985  Japan .................... 307/269

*Primary Examiner*—John Zazworsky
*Attorney, Agent, or Firm*—Steven R. Biren

[57] ABSTRACT

In relatively large systems of (integrated) circuits, data signals can experience a delay which is in the order of magnitude of a clock-pulse period. The receiving circuit (i.e. receiving the data signal) then receives the data signal too late (the clock pulse has ceased) and can at that moment no longer take over the data signal for further processing or transport. In the system according to the invention the clock pulses are led via a delaying element (for example, the inverting circuits in series) to the receiving circuit (slave of the master/slave flip-flop). The data output of the receiving circuit is connected to a data input of another circuit (master of another master/slave flip-flop), which receives the undelayed clock pulses, the data delay between the receiving circuit and the other circuit being negligible. The data delay is thus distributed over two clock pulses.

5 Claims, 1 Drawing Sheet

LOGIC CIRCUITS WITH DATA RESYNCHRONIZATION

This is a continuation of application Ser. No. 251,067 filed Sept. 27, 1988 which was a continuation of Ser. No. 125,749 filed Nov. 20, 1987, which was a continuation of Ser. No. 890,599, filed July 30, 1986, all now abandoned.

BACKGROUND OF THE INVENTION

The invention relates to a system of logic circuits in which a logic signal is transferred from a first circuit to a second circuit under the control of clock pulses.

In relatively small systems of integrated circuits the delay time between the clock pulses to be applied, for example, to two flip-flop circuits and clock pulses derived from the same clock are considerably shorter than the clock-pulse period. Similarly, logic signals which are sent from a first circuit to a second circuit under the control of clock signals will only appear at the desired input of the second circuit after the lapse of some delay time. With increasing clock frequency and increasing size of systems of integrated circuits the delay times amount in total to the same order of magnitude as the clock-pulse period, which disturbs the synchronization of operation of the various circuits in a system of integrated circuits.

If systems of integrated circuits are mounted on a substrate with printed wiring (p.w.b.), the problem also arises that, because of the distance of the integrated circuits from each other and the high clock frequencies, the delay times to which the logic signals to be transported are subjected become too large in relation to the clock-pulse period. The loss of information to which this gives rise is undesirable.

SUMMARY OF THE INVENTION

It is the objective of the invention to provide a system of circuits in which measures have been taken which, despite the geometrical distance between two circuits of the system of circuits, which may or may not have been integrated on a semiconductor substrate, maintain the synchronization of the various circuits cooperating with each other.

A system of circuits according to the invention is characterised in that the clock pulses are led to the second circuit via a delaying element and that a delay caused to the locig signal by the geometrical distance and by circuits, if any, located between the first and second circuit is smaller than the total duration of a clock-pulse period and the delay time of the delaying element. Such a form of embodiment of a system of (integrated) circuits has the advantage that the delay occurring is in fact distributed over two clock-pulse periods, so that any delay occurring may be greater than a clock-pulse period without loss of synchronization occurring.

A preferred form of embodiment of a system of logic circuits is characterized in that the first and second circuits are respectively the master and slave in a master/slave flip-flop, the delay and a signal transfer time of the slave being jointly smaller than the total duration. The preferred form of embodiment of the system of (integrated) circuits has the advantage that the delay occurring is taken up by the slave part of the master/slave flip-flop, so that when the next clock pulse occurs the logic signal from the slave can be transferred synchronized to the master of a following master/slave flip-flop.

It should be noted that it is in fact known from the British patent application GB-A 21 05 936A how to delay, in a system of integrated circuits, clock pulses which are led to a second circuit which has to take over a logic signal from a first circuit. The problem in the system of circuits described in the British application is that the circuits are inherently slow and that, consequently, the logic signal to be taken over is not available sooner.

A method is also known from the I.B.M. Technical Disclosure Bulletin, vol. 25, no. 10, March 1983, pages 5358–60, for delaying clock pulses and sending them to various circuits of a system of circuits. The intended aim here is to cause the various circuits to switch, each at a different moment, in order to reduce the peak-power dissipation.

BRIEF DESCRIPTION OF THE DRAWING

The invention will now be described with reference to examples which are presented in a drawing, in which.

DESCRIPTION OF THE PREFERRED EMBODIMENTS

Figure 1:
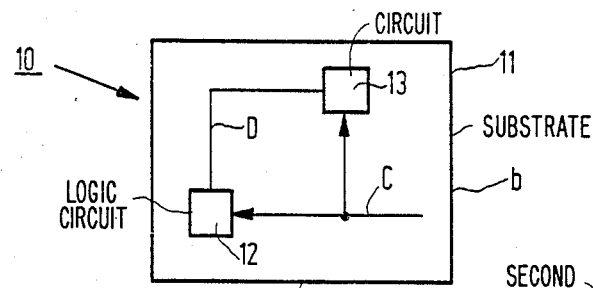
FIG. 1 shows schematically a system of integrated circuits.

Shown in FIG. 1, in a very schematic manner, is a system of circuits 10 which is integrated on a semiconductor substrate 11. Of the system of circuits 10 only two circuits 12 and 13 cooperating with each other are shown. Circuit 12 contains logic information which is taken via data connection D from circuit 12 to circuit 13 under the control of clock pulses Clk, which are applied via a clock-pulse line C both to circuit 12 and to circuit 13. In a system of integrated circuits of any appreciable size the length l and the width b of the semiconductor substrate 11 will certainly be several millimeters and the data line D and the clock-pulse line C will have a length which may then also be several millimeters. A logic signal emitted by circuit 12 will thus experience a delay on line D. If the delay becomes excessive, circuit 13 will not take over the logic signal emitted by 12, which is undesirable.

Figure 2:
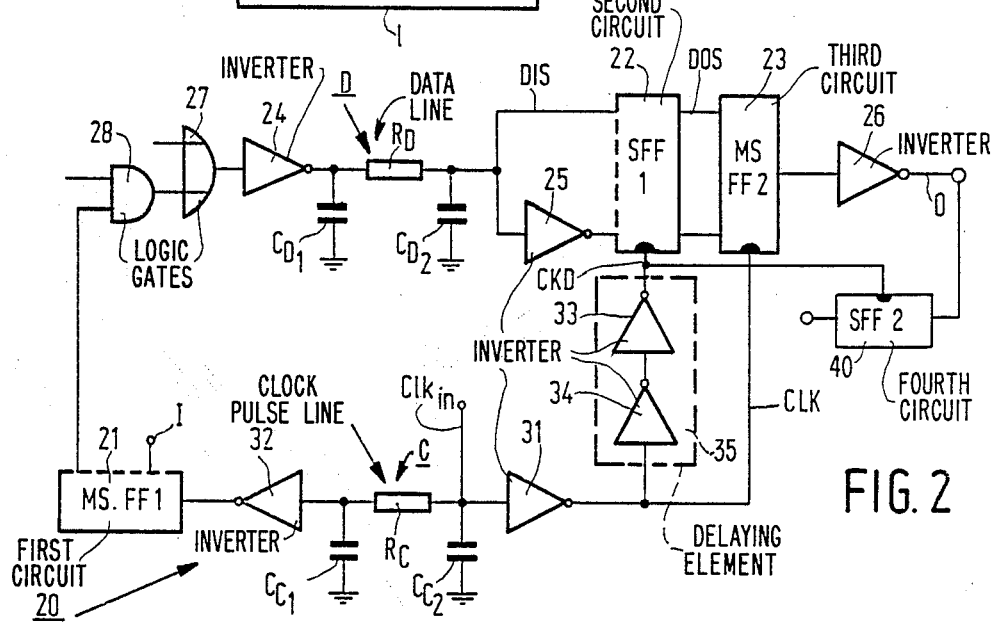
FIG. 2 shows a part of a system of circuits according to the invention.

FIG. 2 shows a part of a system of circuits 20 according to the invention. The part reproduced shows a first, a second and a third circuit 21, 22 and 23, various inverting circuits 24, 25 and 26, and some logic gates 27 and 28, a data line D and a clock-pulse line C. With their length the data line D and the clock-pulse line C constitute a non-negligible resistance $R_D$, $R_C$ and a capacitance $D_D$, $C_C$ in relation to the substrate for the signals to be transported by them. Since the capacitances $C_D$ and $C_C$ are distributed over the entire length of the data line D and the clock-pulse line C, they are each shown in FIG. 2 as two capacitances $C_{D1}$, $C_{D2}$, $C_{C1}$ and $C_{C2}$ on either side of the resistors $R_D$ and $R_C$.

The clock pulses CK are applied to a clock input Clkin in order to drive circuits 21, 22 and 23. As usual, the clock pulses are led to circuits 22 and 23 via an inverter 31 (for amplification of the clock pulse) and to the first circuit 21 via the clock-pulse line C and an inverter 32. After receipt of a clock pulse the first circuit 21 will send a logic signal received at input I, via the logic gates 27 and 28 and via the data line D, to the second circuit 22 which, if a clock signal is present at its clock input, will take over this logic signal. If the clock pulses CK have a high clock frequency, the delays generated by (the clock-pulse line C and) the data line D will be of the same order of magnitude as the clock-pulse period.

Figure 3:
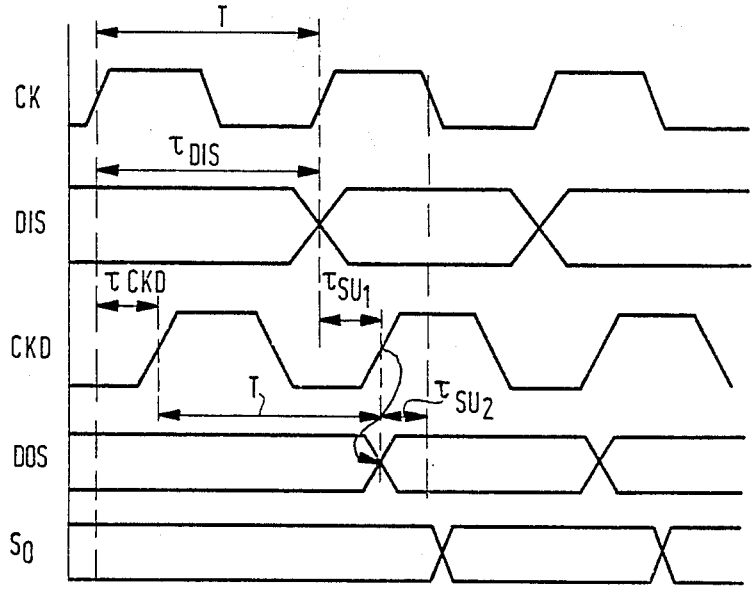
FIG. 3 shows time diagrams of signals occurring in the circuit shown in FIG. 2.

These various points will now be explained further with reference to FIG. 3. CK in FIG. 3 indicates the clock pulses as they are applied to the third circuit 23 via inverter 31. The information signal generated with the clock pulse CK and by circuit 21 occurs after some delay at the inputs of circuit 22 (input DIS and via inverter 25). The signal DIS is shown in FIG. 3. The delay $\tau_{DIS}$ in this example is of the same order of magnitude as the clock-pulse period T. There is now no time or scarcely any time available for the circuit 22 to take over the information signal DIS and adjust itself to it, so that the information signal DIS is in danger of being lost.

To avoid this development, the clock pulses CK are applied via a delaying element 35, here in the form of two inverting circuits 33, 34 connected in series, to the second circuit 22. Since clock pulses CKD now drive circuit 22 with a certain delay $\tau_{CKD}$, a signal take-over time $\tau_{SU1}$ (set-up time) is arranged for circuit 22 so that circuit 22 can take over the information signal. The total delay $\tau_{DIS}$ between circuits 21 and 22 is now in fact distributed over two clock periods. It should be noted that the signal set-up time $\tau_{SU2}$ for the third circuit 23 consequently becomes shorter for the take-over of the output signal DOS from circuit 22. As a consequence of this it is a requirement that only a signal delay which is essentially smaller that the duration of the clock pulse may occur between circuit 22 and circuit 23. It is also essential that the delay time $\tau_{CKD}$ plus the signal take-over time $\tau_{SU2}$ of the third circuit 23 must be smaller than the time duration in which the clock pulse CK is "high" (for example, T/2). After the signal take-over by the third circuit 23 upon the second clock pulse, there appears, after a short delay, an output signal SO at output 0 via inverter 26. The information signal from the third circuit 23 has, of course, to be taken to a fourth ("distant") circuit in the same manner as from circuit 21 to circuit 22. The first and second, and third and fourth circuits 21 and 22, 23 and 40 will preferably always form a master / slave flip-flop circuit, in which the first and third circuits 21 and 23 will always be the master and the second and fourth circuits 22 and 40 will always be the slaves. It is then important that the slave (circuit 22) of the information-signal transmitting flip-flop (21+22) should be in the immediate vicinity of the master (circuit 23) of the receiving master/slave flip-flop.

Although the examples given above relate only to a system of circuits integrated on a semiconductor substrate, the invention also extends to systems of circuits which consist of different circuits and which (may or may not themselves be integrated circuits and) are brought together on a carrier with printed wiring (printed wiring or circuit board, hybrid integrated circuits on a ceramic carrier).

What is claimed is:

1. A system of logic circuits comprising at least a first circuit and a second circuit, a data line for transferring a logic signal from said first circuit to said second circuit, and a clock line for providing a clock signal having clock pulses to said first circuit to control the transfer of the logic signal, said data line and said clock line each causing a delay in transmission of logic signals and clock pulses, respectively, and a delaying element for providing delayed clock pulses to said second circuit, wherein the total logic signal delay between said first circuit and said second circuit caused by at least one of geometrical distance and intervening circuit elements is less than the sum of the duration of a clock pulse period and the delay time of said delaying element and said first circuit and said second circuit each comprise a bistable circuit.

2. A system as claimed in claim 1, characterized in that the first and second bistable circuits comprise, respectively, the master and slave of a master/slave flip-flop, the delay time and a signal take-over time of the slave together being smaller than said sum of the duration of a clock pulse period and the delay time of said delaying element.

3. A system as claimed in claim 1, characterized in that the first and second bistable circuits comprise at least first and second master/slave flip-flop (FF) circuits, in which a logic signal from the first master/slave flip-flop circuit comprising a transmitting master/slave FF circuit is provided to the second master/slave flip-flop circuit comprising a receiving master/slave FF circuit, under the control of said clock signal which is provided to the masters of the master/slave FF circuits and via said delaying elements to the slaves of the master/slave FF circuits, the slave of the transmitting FF circuit located adjacent the master of the receiving FF circuit being integrated so that a delay of the signal from the transmitting slave to the receiving master is essentially smaller than the clock-pulse duration.

4. A system as claimed in claim 1, 2 or 3, further comprising a third circuit, characterized in that the sum of the delay time of the delaying element and a signal take-over time of said third circuit connected to an output of the second circuit, which third circuit comprises a master flip-flop (FF) and takes over the logic signal under the control of clock pulses, is at most equal to the duration of said clock signal.

5. A system as claimed in claim 1, 2 or 3, characterized in that the delaying element comprises at least two inverting circuits connected in series.

* * * * *